(12) United States Patent
Tsai et al.

(10) Patent No.: US 8,101,437 B2
(45) Date of Patent: Jan. 24, 2012

(54) METHOD OF FORMING THREE-TERMINAL SOLAR CELL ARRAY

(75) Inventors: Hung-Chun Tsai, Hsinchu (TW); Liang-Ji Chen, Pak Shek Kok (TW); Yu-Ting Lin, Hsinchu (TW); Yaw-Ming Tsai, Taichung Hsien (TW)

(73) Assignee: Du Pont Apollo Limited, Pak Shek Kok, N.T. (HK)

( * ) Notice: Subject to any disclaimer, the term of this patent is extended or adjusted under 35 U.S.C. 154(b) by 0 days.

(21) Appl. No.: 12/981,429

(22) Filed: Dec. 29, 2010

(65) Prior Publication Data

US 2011/0159629 A1 Jun. 30, 2011

Related U.S. Application Data

(60) Provisional application No. 61/291,619, filed on Dec. 31, 2009.

(51) Int. Cl.
*H01L 21/00* (2006.01)
*H01L 31/00* (2006.01)

(52) U.S. Cl. ...... 438/19; 438/57; 136/255; 257/E33.064

(58) Field of Classification Search .................. 438/19, 438/57; 136/255

See application file for complete search history.

(56) References Cited

U.S. PATENT DOCUMENTS

2009/0242018 A1* 10/2009 Ahn et al. ............... 136/255

* cited by examiner

*Primary Examiner* — William D Coleman
(74) *Attorney, Agent, or Firm* — Dugan & Dugan, PC

(57) ABSTRACT

A method for manufacturing three-terminal solar cell array is provided. In this method, only four major scribing or etching steps are needed to expose the three conductive layers of the three-terminal solar cell and isolate the individual solar cells.

10 Claims, 4 Drawing Sheets

METHOD OF FORMING THREE-TERMINAL SOLAR CELL ARRAY

RELATED APPLICATIONS

This application claims priority to U.S. Provisional Application Ser. No. 61/291,619, filed Dec. 31, 2009, which is herein incorporated by reference.

BACKGROUND

1. Technical Field

The disclosure relates to solar cells. More particularly, the disclosure relates to a method of forming multi-bandgap solar cell array.

2. Description of Related Art

It is well known that the most efficient conversion of radiant energy to electrical energy with the least thermalization loss in semiconductor materials is accomplished by matching the photon energy of the incident radiation to the amount of energy needed to excite electrons in the semiconductor material to transcend the bandgap from the valence band to the conduction band. However, since solar radiation usually comprises a wide range of wavelengths, use of only one semiconductor material with one band gap to absorb such radiant energy and convert it to electrical energy results in large inefficiencies and energy losses to unwanted heat. Accordingly, the benefits of using tandem solar cells incorporating both wide bandgap and narrow bandgap materials have been recognized.

SUMMARY

Accordingly, a method for manufacturing three-terminal solar cell array is provided.

According to an embodiment, a first transparent conductive layer, a first semiconductor layer, a second transparent conductive layer, a second semiconductor layer, and a third conductive layer are sequentially formed on a transparent substrate. A first opening is formed in the third conductive layer, the second semiconductor layer, the second transparent conductive layer, and the first semiconductor layer to expose the first transparent conductive layer. A second opening is formed in the third conductive layer and the second semiconductor layer to expose the second transparent conductive layer. The order of the steps for forming the first and the second openings can be exchanged.

Next, third openings are formed in the third conductive layer, the second semiconductor layer, the second transparent conductive layer, the first semiconductor layer, and the first transparent conductive layer to expose the transparent substrate. The extending direction of the third openings is perpendicular to the extending direction of the first opening and the second opening to isolate individual solar cells.

Then, a conformal dielectric layer is formed on the upper surface of the solar cells and the transparent substrate. A fourth opening, a fifth opening, and a sixth opening are formed to respectively expose the first transparent conductive layer, the second transparent conductive layer, and the third conductive layer by etching or scribing the dielectric layer. Subsequently, a first metal line, a second metal line, and a third metal line are formed in the fourth, fifth, and sixth openings to directly connect the first transparent conductive layer, the second transparent conductive layer, and the third conductive layer, respectively.

According to another embodiment, an encapsulating layer is further formed on the dielectric layer after forming the first, second, and third metal lines.

According to yet another embodiment, the encapsulating layer is further covered by a back plate.

Accordingly, a rather easy process for manufacturing three-terminal solar cell array is provided. Moreover, the three-terminal design to parallel connect the two cells of this solar cell can effectively increase the total output power of the solar cell.

It is to be understood that both the foregoing general description and the following detailed description are by examples, and are intended to provide further explanation of the invention as claimed.

DETAILED DESCRIPTION

Figure 1A:
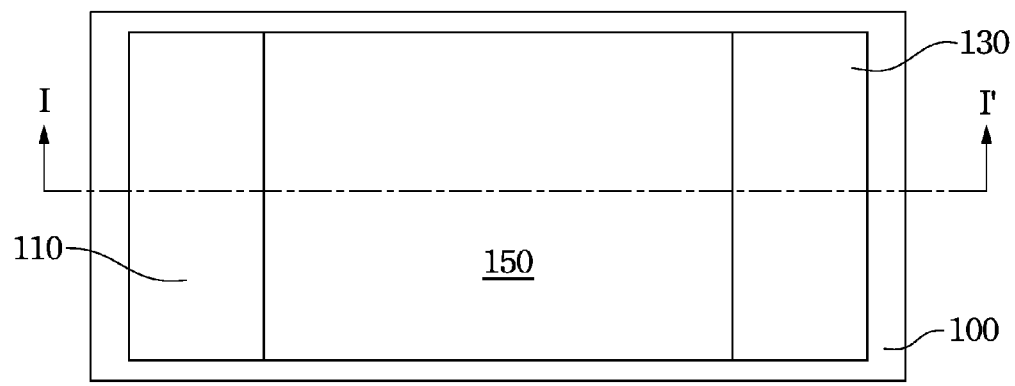
FIGS. 1-4 are diagrams of a process for manufacturing three-terminal solar cell array according to one embodiment of this invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

FIGS. 1-4 are diagrams of a process for manufacturing three-terminal solar cell array according to one embodiment of this invention.

Figure 1B:
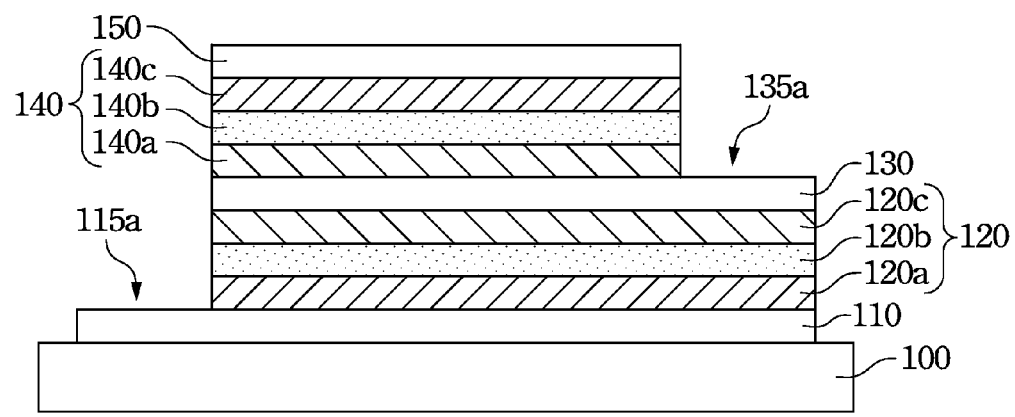

FIG. 1A is a top view of FIG. 1B, and FIG. 1B is a cross-sectional view of the cutting line I-I' in FIG. 1A. In FIGS. 1A-1B, a first transparent conductive layer 110, a first semiconductor layer 120, a second transparent conductive layer 130, a second semiconductor layer 140, and a third conductive layer 150 are sequentially formed on a transparent substrate 100. Then, a first opening 115a is formed by sequentially removing the third conductive layer 150, the second semiconductor layer 140, the second transparent conductive layer 130, and the first semiconductor layer 120 to expose the first transparent conductive layer 110. Similarly, a second opening 135a are formed by sequentially removing the third conductive layer 150 and the second semiconductor layer 140 to expose the second transparent conductive layer 130. The order of the steps for forming the first and the second openings 115a and 135a can be exchanged.

The material of the transparent substrate 100 can be glass or quartz, for example.

The material of the first transparent conductive layer 110 and the second transparent conductive layer 130 can be a metal oxide or a complex metal oxide. The metal oxides can be $PbO_2$, $CdO$, $Tl_2O_3$, $Ga_2O_3$, $ZnPb_2O_6$, $CdIn_2O_4$, $MgIn_2O_4$, $ZnGaO_4$, $AgSbO_3$, $CuAlO_2$, $CuGaO_2$ or $CdO$—$GeO_2$, for example. The complex metal oxide can be AZO (ZnO: Al), GZO (ZnO: Ga), ATO ($SnO_2$: Sb), FTO ($SnO_2$:F), ITO ($In_2O_3$:Sn), or $BaTiO_3$.

The first semiconductor layer 120 and the second semiconductor layer 140 above respectively have a first bandgap and a second bandgap, and the first bandgap is equal to or larger than the second bandgap. The material of the first semiconductor layer 120 and the second semiconductor layer 140 above can be silicon, SiGe, cooper indium gallium selenide (CIGS), or CdTe, for example. The silicon above can be amorphous silicon, or poly silicon. The first semiconductor layer 120 comprises a first p-type semiconductor layer 120a, a first intrinsic semiconductor layer 120b, and a first n-type semiconductor layer 120c. The second semiconductor layer 140 comprises a second n-type semiconductor layer 140a, a second intrinsic semiconductor layer 140b, and a second p-type semiconductor layer 140c. Alternatively, the first semiconductor layer 120 comprises a first n-type semiconductor layer 120a, a first intrinsic semiconductor layer 120b, and a first p-type semiconductor layer 120c. The second semiconductor layer 140 comprises a second p-type semiconductor layer 140a, a second intrinsic semiconductor layer 140b, and a second n-type semiconductor layer 140c. Moreover, the first intrinsic semiconductor layer 120b and the second intrinsic semiconductor layer 140b can be omitted in some embodiments.

The material of the third conductive layer can be a transparent conductive material or a metal. The transparent conductive material is the same as the material of the first transparent conductive layer 110 and the second transparent conductive layer 130 and is hence omitted here. The metal can be Al, Ag, Ti, or Cu, for example.

The method of forming the first opening 115a and the second opening 135a can be laser scribing, mechanical scribing, or chemical etching using an etching paste, for example.

Figure 2A:
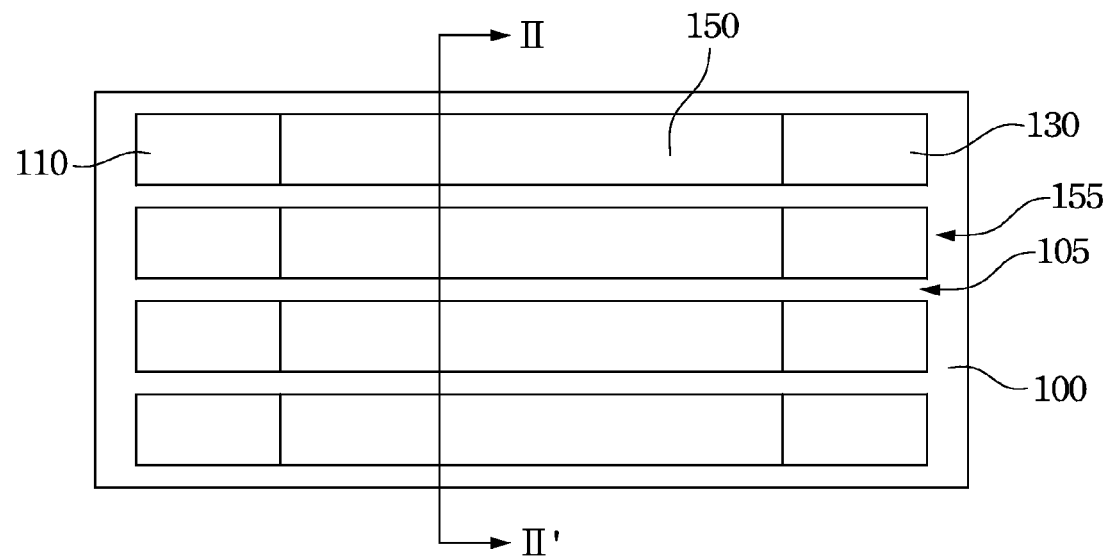
Figure 2B:
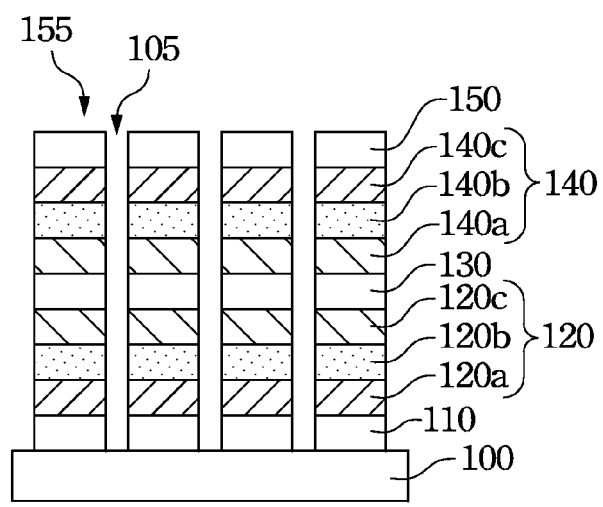

FIG. 2A is a top view of FIG. 2B, and FIG. 2B is a cross-sectional view of the cutting line II-II' in FIG. 2A. In FIGS. 2A-2B, third openings 105 are formed by sequentially removing the third conductive layer 150, the second semiconductor layer 140, the second transparent conductive layer 130, the first semiconductor layer 120, and the first transparent conductive layer 110 to expose the transparent substrate 100. The third openings 105 are perpendicular to the first opening 115a and the second opening 135a to isolate individual solar cells 155. The third opening 105 can be formed by laser scribing, mechanical scribing, or chemical etching using an etching paste, for example.

Figure 3A:
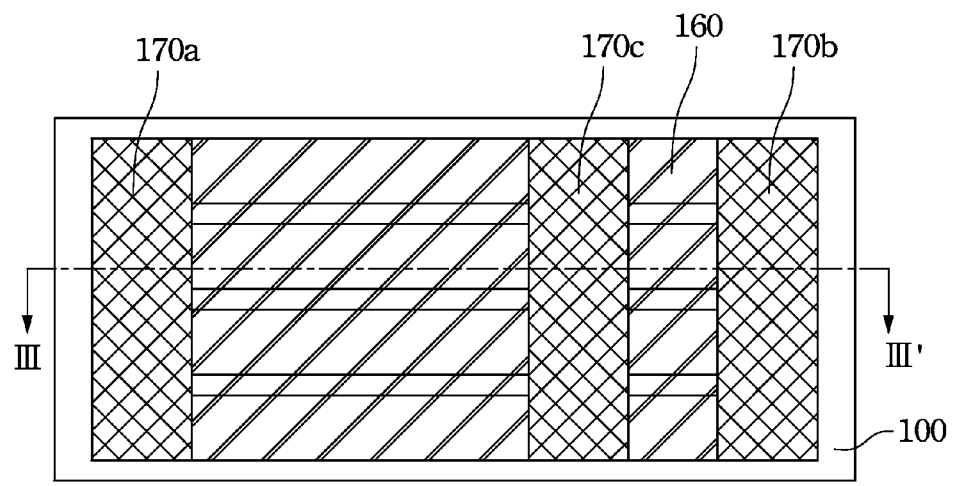
Figure 3B:
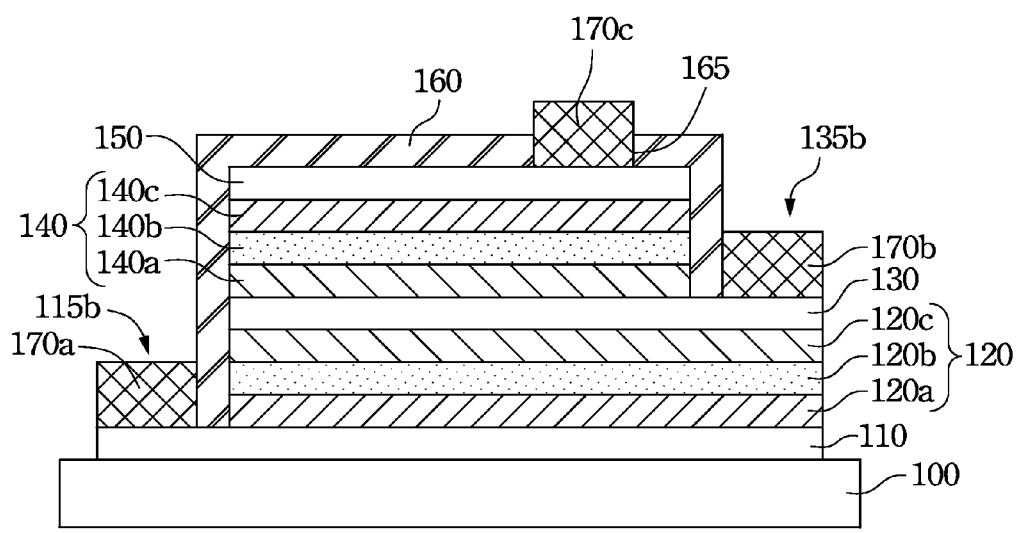

FIG. 3A is a top view of FIG. 3B, and FIG. 3B is a cross-sectional view of the cutting line III-III' in FIG. 3A. In FIGS. 3A-3B, a conformal dielectric layer 160 is formed on the upper surface of the solar cells 155 and the transparent substrate 100. Then, a fourth opening 115b, a fifth opening 135b, and a sixth opening 165 are formed to respectively expose the first transparent conductive layer 110, the second transparent conductive layer 130, and the third conductive layer 150 by etching the dielectric layer 160. Next, a first metal line 170a, a second metal line 170b, and a third metal line 170c are formed in the fourth opening 115b, the fifth opening 135b, and the sixth opening 165 to directly connect the first transparent conductive layer 110, the second transparent conductive layer 130, and the third conductive layer 150, respectively. The first metal line 170a, the second metal line 170b, and the third metal line 170c can be formed by adhering metal ribbon to the bottom of the he fourth opening 115b, the fifth opening 135b, and the sixth opening 165 by silver glue, for example. The material of the first, second, and third metal lines 170a, 170b and 170c can be Al, Ag, Ti, or Cu, for example.

Figure 4:
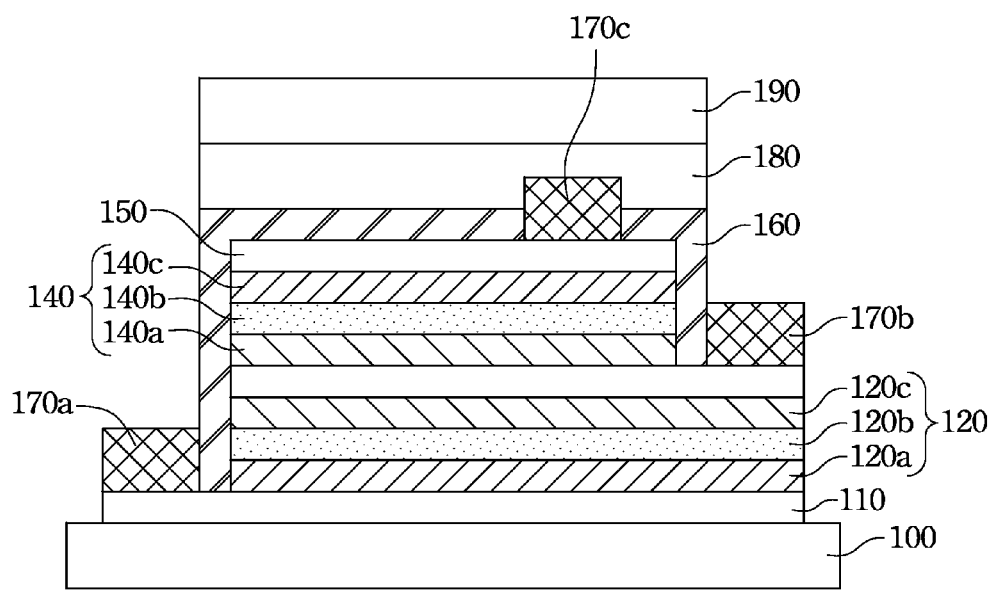

FIG. 4 is a cross-sectional diagram of the completive structure of the solar cell 155 in FIG. 3B. In FIG. 4, an encapsulating layer 180 is formed on the dielectric layer 160. The encapsulating layer 180 is an insulator to prevent oxygen and moisture from penetrating the encapsulating layer 180. The material of the encapsulating layer 180 can be Ethylene vinyl acetate (EVA), or polyvinylbutyral (PVB) etc.

Next, a back plate 190 is used to cover the encapsulating layer 180 to finish the process. The back plate 190 can be a glass plate or a backsheet etc.

In the structure shown in FIG. 4, the light entering site of the three-terminal solar cell is at the transparent substrate 100. The first transparent conductive layer 110 is used as an emitter electrode of the first cell composed of the first transparent conductive layer 110, the first semiconductor layer 120 and the second transparent conductive layer 130. The third conductive layer 150 is used as an emitter electrode of the second cell composed of the second transparent conductive layer 130, the second semiconductor layer 140 and the third conductive layer 150. The second transparent conductive layer 130 is used as a collector electrode of the first and the second cells. Therefore, the first cell and the second cell are parallel connected.

Accordingly, a rather easy process for manufacturing three-terminal solar cell array is provided. Moreover, the three-terminal design to parallel connect the two cells of this solar cell can effectively increase the total output power of the solar cell.

The reader's attention is directed to all papers and documents which are filed concurrently with his specification and which are open to public inspection with this specification, and the contents of all such papers and documents are incorporated herein by reference.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

What is claimed is:

1. A method for manufacturing three-terminal solar cell array, comprising:

sequentially forming a first transparent conductive layer, a first semiconductor layer, a second transparent conductive layer, a second semiconductor layer, and a third conductive layer on a transparent substrate;

forming a first opening in the third conductive layer, the second semiconductor layer, the second transparent conductive layer, and the first semiconductor layer to expose the first transparent conductive layer;

forming a second opening in the third conductive layer and the second semiconductor layer to expose the second transparent conductive layer;

forming third openings in the third conductive layer, the second semiconductor layer, the second transparent conductive layer, the first semiconductor layer, and the first transparent conductive layer to expose the transparent substrate, wherein the extending direction of the third openings is perpendicular to the extending direction of the first opening and the second opening to isolate individual solar cells;

forming a conformal dielectric layer on the upper surface of the solar cells and the transparent substrate;

forming a fourth opening, a fifth opening, and a sixth opening to respectively expose the first transparent conductive layer, the second transparent conductive layer, and the third conductive layer by etching the dielectric layer; and forming a first metal line, a second metal line, and a third metal line respectively in the fourth, fifth, and sixth openings to directly connect the first transparent conductive layer, the second transparent conductive layer, and the third conductive layer.

2. The method of claim 1, further comprising forming an encapsulating layer on the dielectric layer after forming the first, second, and third metal lines.

3. The method of claim 1, wherein the first opening to the sixth opening are formed by laser scribing, mechanical scribing, or chemical etching.

4. The method of claim 1, wherein the material of the first and second transparent conductive layer is metal oxide or a complex metal oxide.

5. The method of claim 1, wherein the material of the first and the second semiconductor layer is silicon, SiGe, cooper indium gallium selenide (CIGS), or CdTe.

6. The method of claim 1, wherein a first bandgap of the first semiconductor layer is larger than a second bandgap of the second semiconductor layer.

7. The method of claim 1, wherein a material of the third conductive layer is a metal oxide, a complex metal oxide, or a metal.

8. The method of claim 1, wherein a material of the first, second, third metal lines is Al, Ag, Ti, or Cu.

9. The method of claim 2, wherein a material of the encapsulating layer is EVA or PVB etc.

10. The method of claim 2, further comprising covering the encapsulating layer by a back plate.

* * * * *